United States Patent [19]

Tsunemitsu et al.

[11] 3,862,017

[45] Jan. 21, 1975

[54] METHOD FOR PRODUCING A THIN FILM PASSIVE CIRCUIT ELEMENT

[76] Inventors: Hideo Tsunemitsu; Hiroshi Shiba, both of c/o Nippon Electric Company, Limited, 7. 15 Shiba Gochome, Tokyo, Japan

[22] Filed: Apr. 24, 1973

[21] Appl. No.: 353,959

Related U.S. Application Data

[60] Division of Ser. No. 292,435, Sept. 26, 1972, abandoned, which is a continuation of Ser. No. 111,850, Feb. 2, 1971, abandoned.

[30] Foreign Application Priority Data

Feb. 4, 1970 Japan ............................... 45-10296

[52] U.S. Cl. ........................ 204/15, 29/625, 29/576, 117/212, 317/234 R

[51] Int. Cl. ......................... C23b 5/48, H01l 11/00

[58] Field of Search ..................................... 204/15; 29/625–628, 576; 317/234 R; 117/212

[56] References Cited

UNITED STATES PATENTS

| | | | |
|---|---|---|---|
| 3,220,938 | 11/1965 | McLean et al. | 204/15 |
| 3,386,011 | 5/1968 | Murray, Jr. et al. | 317/101 |
| 3,489,656 | 1/1970 | Balde | 204/15 |
| 3,607,679 | 9/1971 | Melroy et al. | 29/625 |
| 3,634,203 | 1/1972 | McMahon | 317/234 |
| 3,766,445 | 10/1973 | Reuter | 204/15 |

*Primary Examiner*—T. M. Tufariello
*Attorney, Agent, or Firm*—Sandoe, Hopgood & Calimafde

[57] ABSTRACT

A thin film of a high resistivity metal such as Ta, Ti, Mo or Nb is formed on a substrate. The side faces of the thin resistive film are surrounded by, and at least a greater part of the top surface of the thin resistive film is covered with an insulating substance which is a compound, such as an oxide or nitride of the high resistivity metal. The thin resistive film and the insulating substance form a substantially flat layer.

8 Claims, 7 Drawing Figures

(A)

(C)

(B)

(D)

METHOD FOR PRODUCING A THIN FILM PASSIVE CIRCUIT ELEMENT

This is a division of application Ser. No. 292,435 filed Sept. 26, 1972, now abandoned which is in turn a continuation of application Ser. No. 111,850 filed Feb. 2, 1971, which is now abandoned.

BACKGROUND OF THE INVENTION

The present invention relates to thin film passive circuit elements, and more particularly to a thin film resistor element which is favorably used in combination with a multilayer wiring structure.

In order to meet the recent demand for large scale integrated circuits, various techniques have been developed to assemble thin film passive circuit elements in a multilayer wiring structure and to increase the package densities of the integrated circuit. It is now required to realize a highly reliable thin film passive circuit element, particularly a thin film resistor which is adapted to such a structure.

An electrical thin film circuit element which has been commonly used in the prior art, is manufactured by depositing a thin metal film of a desired thickness, by means of a sputtering method or vacuum evaporation method, on to a main surface of an insulating substrate having a flat surface, and then removing the thin metal film except for a predetermined part thereof that is to be the electrical circuit element by means of a selective etching method. In an alternate prior art technique, the thin film circuit element is manufactured by depositing a thin metal film of a desired thickness on to a predetermined portion of a substrate that is to be the electrical circuit element by means of a selective vacuum evaporation method in which a metal mask is used.

However, in manufacturing a thin film resistor by selective etching or selective vacuum evaporation of a thin metal film, the accurate control of the thickness of the deposited thin film is very difficult to achieve, which results in the difficulty in realizing a thin film resistor having a predetermined resistance value. Moreover, the known selective etching or selective evaporation techniques, are not of sufficient precision as a pattern forming method, which further adversely affects the possibility of realizing a predetermined resistance value of the thin film resistor.

In the prior art method of leaving a metal film on a predetermined portion of a substrate either by selective etching or selective evaporation, the thin film resistors extend upwardly from a surface of the substrate. Therefore, the main surface of this structure will not remain flat but will become uneven by the thickness of the metal film. This unevenness will cause a significant decrease in reliability if another thin film passive circuit elements or another wiring layer is laminated onto the thin resistor film. Moreover, because a selectively etched or deposited thin metal film resistor is bare-surfaced, the resistor will deteriorate if the structure is exposed to the air or a similar atmosphere.

It is, therefore, an object of the present invention to provide a thin film passive circuit element having high reliability.

It is another object of the present invention to provide a highly reliable thin film passive circuit element, whose surface is substantially co-planar with the surrounding portion, which has excellent electrical characteristics, and which is easily combined with a multilayer wiring structure.

It is still another object of the present invention to provide a process for fabricating a highly reliable thin film passive circuit element.

SUMMARY OF THE INVENTION

According to the present invention, a thin metallic resistor film having a required thickness and area is surrounded by an insulating layer formed of a chemical compound, particularly an oxide or nitride, of the same metal. The whole or greater part of the top surface of the thin resistor film is preferably covered with the same compound. The surface of the layer containing the resistor film is substantially flat and parallel to the substrate.

For the realization of the present invention, a preferred material for use as the resistor metal is tantalum, titanium, molybdenum, or niobium each of which has a relatively high resistivity and is anodizable.

It is possible to laminate a plurality of resistance element layers comprising the thin film resistors and an insulating layer of a chemical compound thereof, particularly an oxide thereof, on a substrate. It is also possible to place a highly conductive wiring layer upon or beneath a resistor layer.

A resistor layer having a substantially flat surface can be obtained by depositing a resistance metal to a uniform thickness, and then converting the metal except for the part thereof which is to form one or more resistors into an insulating material by oxidation or nitridation. For the purpose of obtaining the insulating material, it is especially preferable to form an oxide of the resistance metal itself by means of anodic oxidation. The insulating material should be constituted in the above-described manner such that it surrounds the thin film resistance element. It is, however, preferable that the insulating material not only surround but also cover the thin resistor film.

If necessary, another thin insulating layer of, for example, silicon dioxide may be formed over the entire surface of the resistor layer comprising the metal resistor film and the insulating film converted from the resistor metal.

Aluminum is most suitable for the wiring metal since it is an anodizable metal and a good conductor. Much as in the case of a resistor layer, aluminum may be selectively anodically oxidized into alumina, an insulating material, which surrounds the aluminum wiring paths and preferably covers the top surface of the wiring paths to make the surface of the wiring layer substantially flat and parallel to the surface of the substrate. Where a resistor layer is to be formed on a wiring layer, it is particularly required to have a flat wiring layer surface and to cover a surface of the wiring layer with the insulating material as described above.

When resistance layers and conductive wiring layers are laminated, one or more apertures must be made at predetermined locations in an insulating film covering the thin film resistors or conductive wiring paths for electrical connection between the wiring paths and the resistors of different layers.

As the material of a substrate having a substantially flat surface, either an insulator such as a ceramic or glass, a metal covered with an insulating film, or a semiconductor is suitable for the purpose of this invention. In the case of a semiconductor substrate including circuit elements formed therein an insulating layer of silicon dioxide or silicon nitride having an aperture for electrical connection may be disposed on the surface of the substrate to electrically connect the circuit elements to a resistor or a conductive wiring path overlying the substrate.

In an integrated circuit device according to the present invention, the surface of the resistor layer therein is substantially flat and the resistor is embedded in an inert insulating material, whereby the reliability of the thin film resistor layer and the integrated circuit including the thin film resistor layer and the multi-level wiring layers will become higher. The multi-level wiring layers used in the present invention are preferably those having a flat surface formed by anodic oxidation in the manner disclosed in a copending U.S. patent application Ser. No. 833,095 filed on June 13, 1969, entitled Semiconductor Device, and assigned to the same assignee as the present application.

The present invention will now be described in detail with reference to the accompanying drawings.

BRIEF DESCRIPTION OF THE DRAWING

Similar or the same parts are designated by the same reference numerals throughout the drawings.

DETAILED DESCRIPTION

Figure 1:
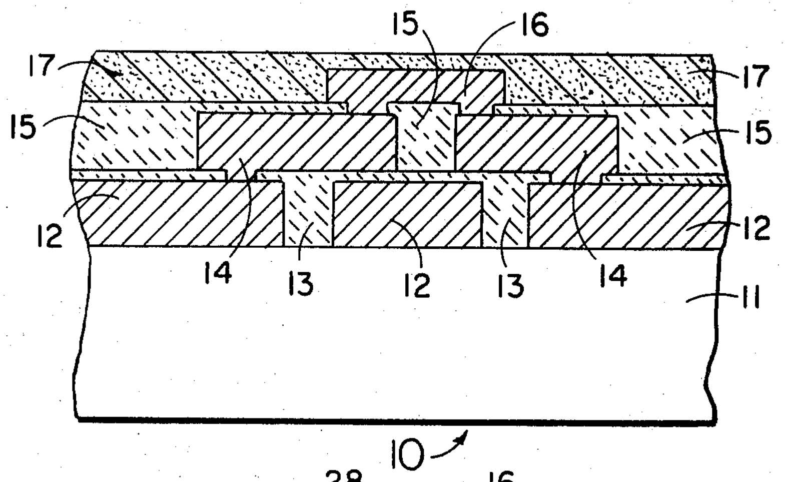
FIGS. 1 through 3 are cross-sectional views of laminated layers of a thin resistor film and wiring conductive path, each showing a preferred embodiment of the present invention.

Referring first to FIG. 1, a semiconductor device generally designated 10 comprises a semiconductor substrate 11 having circuit elements (not shown) formed therein. First aluminum wiring paths 12 are formed at the predetermined location on the substrate 11 and an alumina film 13 surrounds and covers the aluminum wiring paths 12 and has a flat surface parallel to the substrate 11. Second aluminum wiring paths 14 are formed on a predetermined surface of the alumina film 13 and another alumina film 15 surrounds and covers the wiring paths 14 and has a flat surface parallel to the substrate 11. A tantalum thin resistor film 16 is formed at a predetermined location on the surface of the alumina film 15, and a tantalum oxide film 17 surrounds and covers the tantalum resistor 16 and has a flat surface parallel to the substrate 11.

In the embodiment of FIG. 1, a multi-level wiring structure comprising the aluminum wiring paths 12 and 14 and alumina films 13 and 15 may be advantageously manufactured by the processing technique disclosed in said copending patent application. The uppermost surface of the multi-level wiring structure is flat and serves as a base for the thin film resistors. The fact that the upper surface of the structure is flat is also true with the embodiment shown in FIG. 1, which has an additional resistor layer fabricated by depositing a tantalum film uniformly over the multi-level wiring structure and anodically oxidizing the tantalum film except for those portions thereof which are to be thin film resistor elements. Because of the surface flatness of the structure it is also possible to laminate another wiring layer onto the thin film resistor layer, as shown in FIG. 2.

Figure 2:
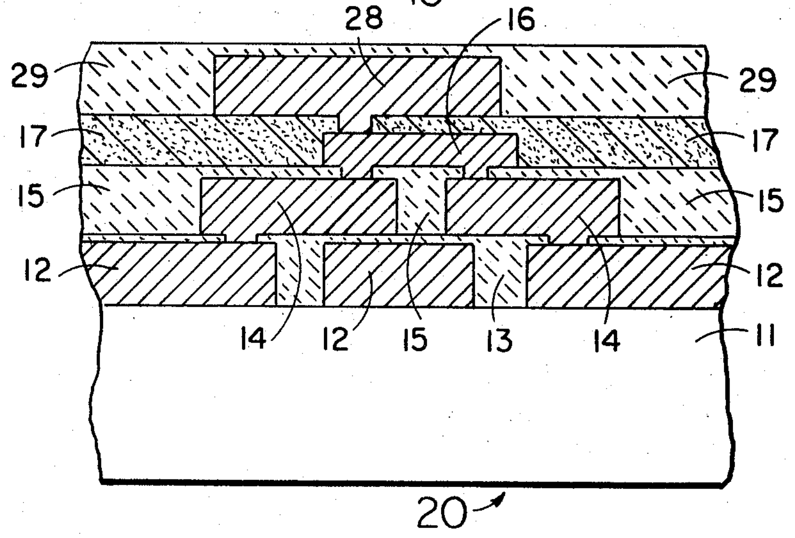

Referring now to FIG. 2, which illustrats another embodiment of the present invention, a semiconductor device generally designated 20 comprises a multi-level aluminum wiring structure and a tantalum thin film resistor layer thereon as shown in FIG. 1. The device 20 further comprises an aluminum wiring 28 formed at predetermined locations on the upper surface of the tantalum oxide film 17, that is, the surface of the tantalum thin film resistor layer, and an alumina film 29 surrounds and covers the wiring 28 and has a surface parallel to the surface of the substrate 11.

Figure 3:
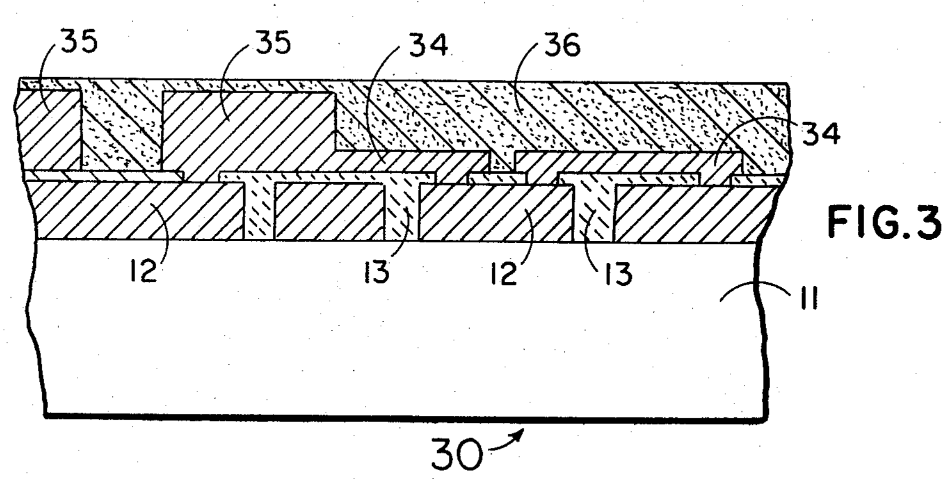

Referring to FIG. 3, a semiconductor device generally designated 30, according to still another embodiment of the present invention, comprises a semiconductor substrate 11 including required circuit elements. Aluminum electrodes or wiring paths 12 and an alumina film 13, surrounding and covering the aluminum electrodes or wiring paths 12 and having a flat surface, are formed by a selective anodic oxidation in a manner described in said copending patent application. Thin film tantalum resistors 34 are formed on the flat upper surface of the alumina film 13 and have apertures provided at predetermined positions. Tantalum wiring paths 35 are formed on the same surface, and a tantalum oxide film 36 surrounds and covers the thin film tantalum resistors 34 and the tantalum wiring paths 35 and has a flat surface parallel to the surface of the substrate 11. In the structure, of FIG. 3, the thin film tantalum resistors and the tantalum wiring paths are constructed by the selective anodic oxidation of a tantalum film deposited uniformly over the surface of the alumina film 13. The difference between the tantalum film resistor and wiring paths lies in the thickness thereof, as shown in FIG. 3, and the difference in the film thickness can be realized by controlling the depth of oxidation during the selective anodic oxidation of the tantalum film.

FIGS. 4(A) through 4(D) illustrate the semiconductor device shown in FIG. 1 at various stages of the manufacture thereof in accordance with the present invention.

At first a multi-level wiring structure is formed, by the manufacturing method disclosed in the above-mentioned copending application, on the surface of the semiconductor substrate 11 including the required circuit elements. The structure illustrated in FIG. 4A, includes aluminum electrodes or wiring paths 12, aluminum wiring paths 14, and alumina films 13 and 15. At the end of the multi-level wiring process, alumina film 15 having a substantially flat surface on the upper main surface of the structure is formed.

Before the formation of a tantalum thin film resistor on the flat surface of the alumina film, apertures 46 are opened at predetermined locations in the alumina film 15 where electrical connections are to be made between the aluminum wirings 14 and a tantalum film resistor, by selectively etching the portions of the aluminum film 15. Then, a thin tantalum film 47 is deposited at a uniform thickness over the upper surface of the multi-level wiring by the sputtering method.

The electrical resistance of the tantalum thin film 47 deposited over the alumina base is measured by means of a four-terminal method to precisely determine the amount by which resistance value of the tantalum thin film is lower than the desired value. Thereafter, the tantalum is anodically oxidized to regulate the resistance value of the film. The electrolyte employed in this operation may be a 1 to 4 percent solution of $NH_4NO_3$, $(NH_4)_2SO_4$, $(NH_4)_2PO_2$, or $(NH_4)_2CO_3$. The thickness of the anodically oxidized film is proportional to the applied electrical voltage. Therefore, the resistance value of the tantalum thin film can be adjusted to a desired value when a constant voltage formation is carried out to convert the tantalum surface into its oxide 48. Thus, tantalum film 47 having a desired resistance value is formed as shown in FIG. 4B.

Figure 4:
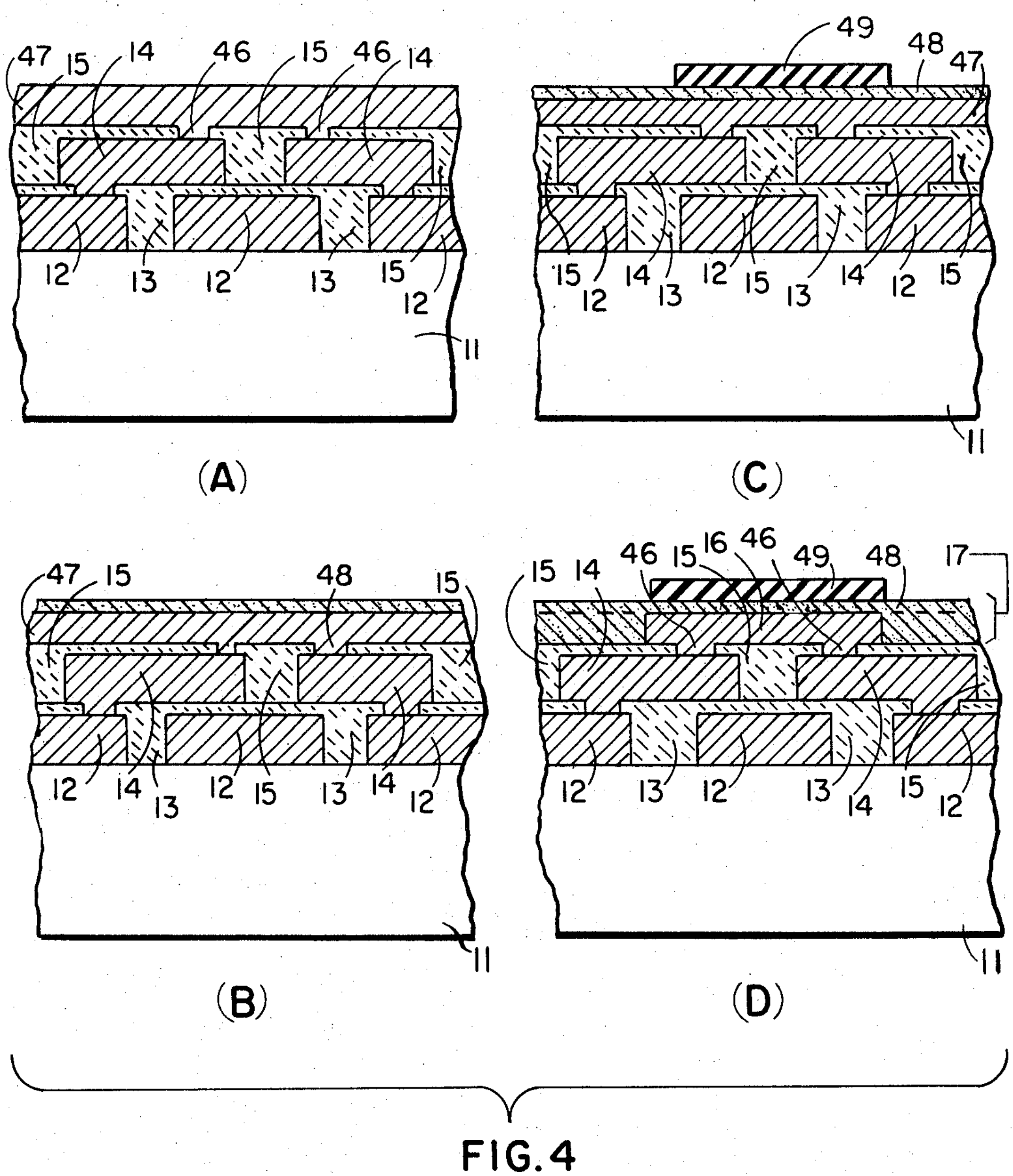
FIGS. 4(A) through 4(D) are cross-sectional views showing successive stages of the fabrication of the laminated layers of FIG. 1.

As shown in FIG. 4C, that part of the surface of the tantalum oxide 48 which is to become a resistor at the final stage is then covered with a photo-resist 49. The photo-resist 49 serves as a mask in a second anodic oxidation in which a positive potential is applied to, both the tantalum thin film 47 and the semiconductor substrate 11. The electrolyte employed in this second anodic oxidation may be the same as that used in the first anodic oxidation for adjusting the resistance value of the tantalum film. The anodizing voltage for the second anodization is an anodic potential required for the complete conversion of the tantalum film 47 into tantalum oxide except for the portion thereof covered by the photo-resist 49.

In the initial stage of the voltage application of the second anodization, the anodic potential is directly applied to the tantalum film 47, but as the formation is advanced and the tantalum begins to change into its oxide to its total thickness, the anodic potential would be applied to a resistor element portion 16 mainly from semiconductor substrate 11 through multi-level wiring paths 12 and 14.

As a result, the structure in which a tantalum thin film 16 having a desired thickness and area which is embedded in tantalum oxide film 17 having a flat upper surface, is obtained as shown in FIG. 4D. Finally, the photo-resist 49 is removed by an appropriate stripping agent to obtain the finished structure shown in FIG. 1.

If an additional wiring layer or a resistor layer is to be formed on the structure of FIG. 1, one or more apertures for electrical connection may be opened, by the selective photo-etching technique, at predetermined locations in the oxide film 17 laying over the thin film resistor 16, and then an appropriate metal is deposited over the oxide film, followed by the formation of the additional wiring paths or the resistor film by means of a selective anodic oxidation technique.

Furthermore, if it is desired that tantalum films with different thickness be included in one tantalum layer as in FIG. 3, the necessary number of photo-resist operations followed by the selective anodic oxidation may be performed, in which the number of photo-resist operations correspond to the number of different thicknesses of the films.

The thin film passive circuit elements manufactured by the method mentioned above, have a very excellent precision of shape. They have also an extreme high reliability because every surface thereof is completely covered with an inert tantalum oxide. It is a major advantage of the present invention that each manufacturing step may be easily carried out and controlled, because a thin film passive circuit element of the present invention is mainly produced by the application of anodic oxidation which is easy to control by regulating the anodizing conditions. Another advantage of the present invention lies in that an additional passive circuit element layer may be applied over the already-formed passive circuit element layer for practical use without decreasing its high reliability, because there is substantially no unevenness on the main surface of the thin film passive circuit element layer.

The substrate used in the present invention may be a planar type semiconductor element, a semiconductor substrate including planar type integrated circuit elements, an insulator plate of ceramics, glass or the like, or a metallic plate coated with an insulating material. Although the above description of the embodiments has been directed to the use of tantalum, it will be apparent that titanum, molybdenum, niobium or the like metal which can be anodically oxidized and which has a relatively high resistivity can be used.

It will be further apparent that the present invention is not to be limited to the above embodiments, and that various variations and modifications could be employed without departing from the spirit and scope of the invention.

We claim:

1. A method of producing a thin film resistor element comprising the steps of preparing a substrate in which at least two conductive wiring paths are embedded, said substrate having an insulating surface thereon; opening at least two apertures in said insulating surface to respectively expose a portion of the surface of each of said two conductive wiring paths; depositing a metallic film having a substantially uniform thickness over the surface of said substrate and said exposed portions, said metallic film being of a metal of high resistivity selected from the group consisting of tantalum, titanium, molybdenum, and niobium; anodically oxidizing said metallic film to convert the surface of said metallic film into the oxide of said metal; and thereafter anodically oxidizing a predetermined portion of said metallic film to convert the remaining thickness of said metallic film into the oxide of said metal except for a predetermined resistor portion in contact with the previously exposed portions of the surfaces of said two conductive wiring paths.

2. The method claimed in claim 1, in which said metallic film is of tantalum.

3. The method claimed in claim 2, in which said conductive wiring paths are of aluminum.

4. A method of producing a thin film resistor element comprising the steps of preparing a substrate having first and second embedded conductive wiring paths and an insulating surface; opening first and second apertures in said surface of said insulating surface to partially expose the surface of said first and second embedded conductive wiring paths, respectively; depositing a film of anodizable material of high resistivity having a substantially uniform thickness over the surface of said substrate, first and second portions of said film extending to and being in contact with said first and second embedded conductive wiring paths through said first and second apertures, respectively; and converting by anodic oxidation a predetermined portion of said film into the oxide of said anodizable material to provide a resistor portion electrically connected between said first and second portions of said film and enclosed by the oxide of said anodizable material.

5. The method claimed in claim 4, in which said converting step includes anodically oxidizing the surface of said film, and thereafter selectively anodically oxidizing the remaining thickness of said film.

6. The method claimed in claim 4, in which said converting step includes anodically oxidizing the surface portion of said film, anodically oxidizing a selected portion of said film to a predetermined depth of said film, and thereafter anodically oxidizing another selected portion of said film to the bottom of said film.

7. The method claimed in claim 4, in which said anodizable material is tantalum.

8. A method of producing a semiconductor device having a thin film resistor element comprising the steps of preparing a semiconductor substrate having circuit elements formed therein, the surface of said semiconductor substrate being coated with an insulating film having apertures to allow electrical connection to said circuit elements; depositing an aluminum film on the surface of said insulating film; anodically oxidizing a selected portion of said aluminum film to provide aluminum wiring paths; depositing a tantalum film on the selectively anodically oxidized aluminum film; and thereafter anodically oxidizing a selected portion of said tantalum film to provide a tantalum resistor element connected between selected ones of said circuit elements.

* * * * *

UNITED STATES PATENT OFFICE

CERTIFICATE OF CORRECTION

Patent No. 3,862,017 Dated January 21, 1975

Inventor(s) TSUNEMITSU et al

It is certified that error appears in the above-identified patent and that said Letters Patent are hereby corrected as shown below:

In the Caption, --Assignee: Nippon Electric Company, Limited --

Signed and sealed this 15th day of July 1975.

(SEAL)
Attest:

RUTH C. MASON
Attesting Officer

C. MARSHALL DANN
Commissioner of Patents
and Trademarks